PROCESS OF EPITAXIAL VAPOR DEPOSITION WITH SUBSEQUENT DIFFUSION INTO THE EPITAXIAL LAYER
Filed June 10, 1960 2 Sheets-Sheet 1

INVENTORS: J. J. KLEIMACK
H. H. LOAR
H. C. THEUERER
BY
H. W. Lockhart
ATTORNEY

INVENTORS: J. J. KLEIMACK
H. H. LOAR
H. C. THEUERER
BY H. W. Lockhart
ATTORNEY

United States Patent Office 3,165,811

Patented Jan. 19, 1965

3,165,811

PROCESS OF EPITAXIAL VAPOR DEPOSITION WITH SUBSEQUENT DIFFUSION INTO THE EPITAXIAL LAYER

Joseph J. Kleimack, Scotch Plains, and Howard H. Loar, Madison, N.J., and Henry C. Theuerer, New York, N.Y., assignors to Bell Telephone Laboratories, Incorporated, New York, N.Y., a corporation of New York Filed June 10, 1960, Ser. No. 35,152

4 Claims. (Cl. 29—25.3)

This invention relates to semiconductor devices and, more particularly, to semiconductor signal translating devices which incorporate epitaxially deposited layers, that is, layers deposited on a semiconductor crystal substrate and which grow with the same crystalline orientation of the substrate.

Although the deposition of epitaxial semiconductor layers or films has been disclosed previously, the application of the technique to semiconductor device fabrication has not been significant. In accordance with this invention, an improved method for producing high quality epitaxially deposited films is applied to the fabrication of new and improved diffused junction semiconductor devices.

Broadly, therefore, an object of this invention is improved semiconductor devices.

More specifically, an object of the invention is semiconductor signal translating devices in which lower series resistances and lower switching times are realized. Moreover, the foregoing objects are achieved without degradation of other performance characteristics.

Other objects of this invention are to reduce the cost of semiconductor devices while, at the same time, improving performance characteristics.

In accordance with this invention, single crystal silicon films of high quality and controlled-orientation are produced by preparing a surface of a silicon wafer by mechanical or chemical surface treatment and cleaning, including careful elimination of residual oxygen, and then by depositing on this prepared surface an epitaxial silicon film produced by the hydrogen reduction of a silicon compound, for example, silicon tetrachloride.

Further, in accordance with this invention, such films may be tailored to the desired conductivity type or to a prescribed conductivity by the inclusion in the hydrogen reduction process of decomposable phosphorus and boron compounds, typically boron and phosphorus halides.

Further, in accordance with the preferred embodiment of the method of this invention, an epitaxially grown film of high resistivity deposited on a low resistivity substrate of silicon is treated further by diffusion techniques already known in the art so as to produce, first, a once diffused base zone in a part of the film and, second, a twice diffused emitter zone enclosed within the once diffused base zone. In this process, the use of the grown film of high resistivity material enables precise control of the thickness of a residual high resistivity collector barrier, while, at the same time, permitting a relatively thick collector portion of low resistivity material for mechanical support and handling. As a consequence, the series resistance of the transistor is minimized, and in a switching transistor where the breakdown voltage of the collector junction may be reduced further, the switching time is lowered by the use of an even thinner high resistivity collector barrier and a thick low resistivity and low lifetime collector portion for mechanical support.

One feature of this invention is a surface preparation process prior to epitaxial film deposition which includes heating the polished or etched and cleaned silicon wafer in a hydrogen atmosphere at about 1290 degrees centigrade to eliminate residual oxygen.

Another feature is the relatively low concentration of silicon tetrachloride in the hydrogen silicon-tetrachloride mixture used for the deposition process.

A further feature of the invention is the fabrication of two diffused junctions of a transistor within the epitaxially grown film on a low resistivity silicon substrate.

The invention and its further objects, features and advantages will be more clearly understood from the following detailed description taken in connection with the drawing in which.

Figure 1:
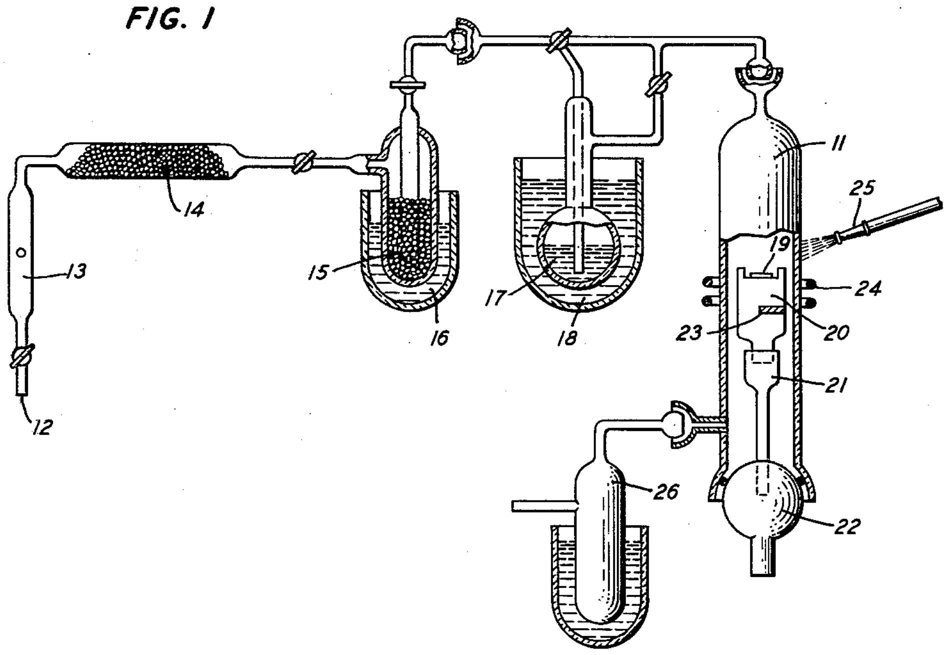
FIG. 1 is a schematic illustration of one form of apparatus for fabricating epitaxially deposited films on semiconductor substrates.

In accordance with the method of this invention, relatively thin epitaxial films of semiconductor material are produced on a single crystal semiconductor substrate. One form of apparatus used for the growth of silicon semi-conductor films is shown in FIG. 1. The apparatus consists of a one inch I.D. quartz tube 11 about 12 inches long with inlet and outlet tubes for the introduction at atmospheric pressure of purified dry hydrogen and silicon tetrachloride vapor. Commercial hydrogen gas is supplied at the inlet 12 and passes through the flow meter 13 and a series of purifiers consisting of a palladinized alundum holder 14 and a trap 15 filled with Linde molecular sieves immersed in a reservoir of liquid nitrogen 16. Silicon tetrachloride vapor is supplied from the flask 17 of liquid silicon tetrachloride submerged in the reservoir 18 of liquid nitrogen. The semi-conductor slice 19 rests in a cup-shaped silicon pedestal 20 supported in a quartz holder 21, which, in turn, is held in a vertical position in the bottom closure cap 22. The pedestal 20 is provided with a low resistivity insert 23 for the necessary coupling to the radio frequency coil 24 which surrounds the quartz tube 11. A water supply 25 provides a water curtain for cooling the outside of the tube 11 to minimize contamination and to prevent deposition of silicon on the inside of the tube wall. The control and measurement of the gas flows are provided by means of conventional valves, stop cocks, and flow meters as shown. The vapor pressure of silicon tetrachloride is controlled by controlling the degree of refrigeration of the flask 17 in which the hydrogen gas is saturated. The flask 26 immersed in liquid nitrogen constitutes an outlet condenser for trapping the silicon tetrachloride.

The initial step in the fabrication of an improved diffused junction transistor, in accordance with this invention, is the preparation of a single crystal silicon slice which forms the substrate upon which the epitaxial film is deposited.

Figure 2:
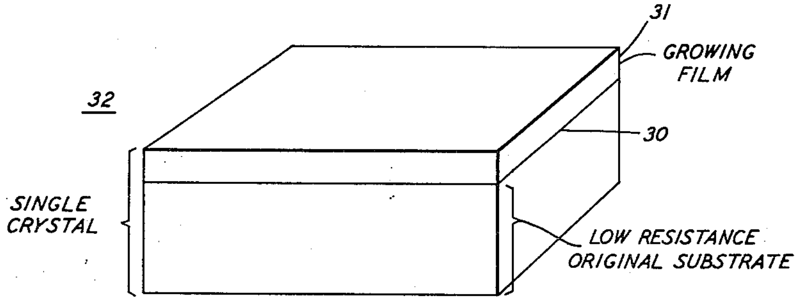
FIG. 2 is a perspective view of a semiconductor wafer and the epitaxial grown film thereon.

As shown in FIG. 2, the original substrate material is a single crystal silicon slice of rectangular form, approximately 300 mils square and five mils thick, of N-type conductivity material having a resistivity of .002 ohm-centimeter. The upper surface 30 of the original slice is carefully polished, etched and cleaned to the end that it have a substantially undamaged crystal surface upon which the epitaxial growth occurs. Although epitaxial film growth can occur, in accordance with this method, on any of the major crystallographic axes, the preferred orientation for the process described is along the <111> orientation because this is most advantageous from the standpoint of the subsequent processing. Accordingly, the slice 32 of FIG. 2 is cut from a <111> oriented ingot and the upper surface is ground flat with 1800 silicon carbide, etched by a counter-current-flow method in a mixture of concentrated nitric acid and five percent hydrofluoric acid, and then cleaned in hydrochloric acid and washed with deionized water.

The slice with the surface thus prepared is mounted in the pedestal 20 of the apparatus of FIG. 1 and inserted within the tube 11. The apparatus is then arranged to provide initially a flow of pure dry hydrogen alone through the tube 11 and the temperature of the slice is raised to about 1290 degrees centigrade by energizing the RF coil 24. This treatment is continued for a short period, typically 30 minutes to eliminate residual surface oxygen prior to the commencement of film growth.

Next, immediately following this heat treatment the slice substrate is brought to a temperature of 1265 degrees centigrade and the valves are set so as to introduce hydrogen saturated with silicon tetrachloride vapor to the tube 11. Typically, the ratio of silicon tetrachloride vapor to hydrogen gas is about 0.02 but may be in the range from fractions of one percent to generally about 20 percent depending on the temperature of the reaction and the time and flow rate. It should be appreciated that the rate of film growth is responsive directly to both the duration and the temperature of the process. Generally, film growth can be carried out at temperatures in the range from 850 degrees centigrade to 1400 degrees centigrade and for periods extending from minutes to hours. For the longer reactions the lower temperature range is desirable to inhibit diffusion of impurities from the substrate into the epitaxial film. These parameters determine the final film thickness and using a silicon tetrachloride to hydrogen ratio of 0.02 and a flow rate of one liter per minute for five minutes at 1265 degrees centigrade, an epitaxial silicon film about 0.3 mil in thickness is produced. This corresponds to the layer 31 on the silicon slice 32 of FIG. 2.

Generally, the film will be deposited uniformly on all surfaces of the wafer. However, only the film on the upper prepared surface 30 of the slice is of interest in connection with the method of this invention. More particularly, the film produced on the upper surface of the wafer is of a high quality, single crystal material having the same orientation as the slice substrate. This is the arrangement encompassed by the term "epitaxial growth or deposition." Thus, the formation of the film is a result of the hydrogen reduction of a decomposable compound of the semiconductor material. In this connection, silicon tetrachloride is a preferred compound for use with silicon substrates and generally the halides of both silicon and germanium, respectively, can be used most advantageously for such film growth. In particular, germanium tetrachloride and iodide are suitable for use in growing germanium epitaxial films.

The resistivity of the epitaxial film 31 thus produced is relatively high in comparison to that of the substrate material. In the absence of an added significant impurity during the film growth process, the resistivity of the grown film will be up to about 100 ohm-centimeters N-type. If a different resistivity film is desired, the gas ambient within the tube 11 can be treated with a decomposable compound of a significant impurity. Typically, suitable compounds for inducing P and N-type conductivity are boron tribromide and phosphorus trichloride, respectively. Generally, the various compounds known in the art for diffusant sources are likewise satisfactory.

After the completion of the film-growing operation, the silicon slice is removed from the apparatus of FIG. 1 and is arranged for standard processing by which a number of transistor elements are made from the single slice. Generally, this method involves successive diffusion steps with appropriate masking and, finally, division of the slice into individual transistor elements about 25 by 35 mils of the type shown in FIG. 3. To facilitate this description, however, only the fabrication of a single element will be treated hereinafter.

Figure 3:
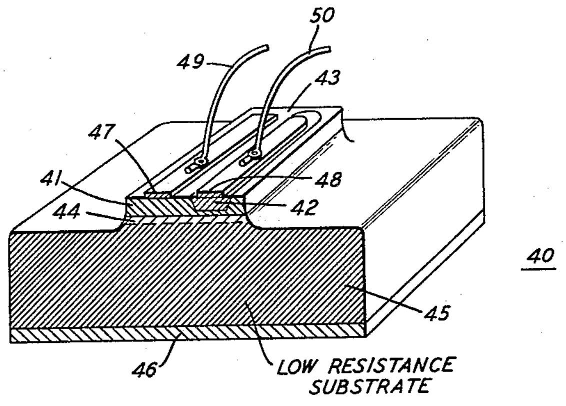
FIG. 3 is a perspective view of an improved diffused junction mesa-type transistor in accordance with this invention.

The transistor element 40 of FIG. 3 is fabricated by successive diffusion treatments to produce the P-type conductivity base zone 41 and the N-type emitter zone 42. First, the element is subjected to a boron diffusion treatment at a temperature and for a time sufficient to convert the film layer to P-type conductivity to a depth of from 0.1 to 0.15 mil leaving a high resistivity layer 44 of the N-type epitaxial film from 0.15 to 0.2 mil thick. However, the thickness of this high resistivity layer will be a function of the original film thickness as well as the diffusion treatments. For some applications the high resistivity film may be less than .05 mil in thickness.

Next, the P-type surface is masked and subjected to a phosphorus diffusion to produce the N-type conductivity emitter zone 42 within a limited portion of the base zone 41. Typically, the emitter zone has a depth of from .06 to .07 mil and width and length of two mils by 20 mils, respectively. However, the optimum size of this zone depends on the desired current rating of the device. An advantage of devices constructed in accordance with this invention resides in the fact that devices having smaller emitters can handle higher currents.

Generally, the foregoing diffusion treatments are in accordance with methods well known in the art. Typically, the base zone boron diffusion may be carried out by predepositing boron from boron oxide ($B_2O_3$) at a temperature of 850 degrees centigrade for 30 minutes in a nitrogen atmosphere. The diffusant is then driven in to a depth of from about 0.13 to 0.15 mil by a heat treatment at 1200 degrees centigrade for about 90 minutes in an atmosphere composed of oxygen and nitrogen. The resulting sheet resistance is typically about 150 ohms per square.

The emitter zone diffusion of phosphorus typically is done in a temperature-zoned furnace using a phosphorus pentoxide source at a temperature of 285 degrees centigrade. The surface of the wafer is oxide-masked and, using a pure oxygen carrier gas, the wafer is heated at 1050 degrees centigrade for from 30 to 45 minutes to provide a junction at a depth of about 0.07 mil. Typically, the sheet resistance resulting is two to three ohms per square.

In a conventional fashion, typically by evaporation and subsequent alloying, metal electrodes 46, 47 and 48 are applied to the low resistance region 45 of the collector zone, to the exposed surface of base zone 41, and to the emitter zone 42, respectively. At this point the mesa 43 is made by etching and, finally, wire leads 49 and 50 are attached to the emitter and base electrodes by thermocompression bonds, as shown.

Figure 4:
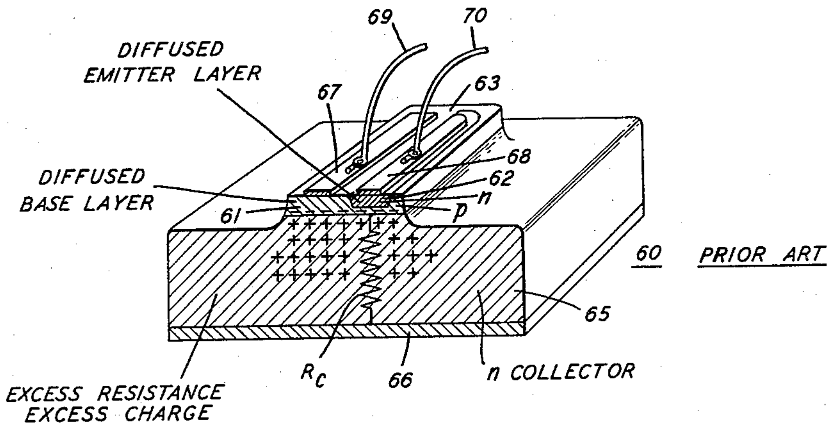
FIG. 4 is a perspective view of a diffused junction mesa-type transistor in accordance with the prior art.

The advantages of the device of FIG. 3 over the structures of the prior art will be appreciated by a comparison with the device illustrated in FIG. 4 which represents the typical diffused junction transistor of current interest. The transistor shown in FIG. 4, which is of the NPN mesa type, has been widely accepted as a versatile device for a variety of applications both for switching and for conventional amplifier and oscillator circuits. However, systems are being developed and contemplated which require improvements in the characteristics of this element, particularly in the direction of a lower voltage drop across the transistor when it is in the conducting condition and in the speed with which a complete switching operation may be accomplished.

Most of the voltage drop across the device of FIG. 4 from the collector electrode 66 to the emitter electrode 68 arises from the electrical resistance of the silicon material itself and the largest fraction of this resistance arises in the collector zone 65. This collector region 65, typically, is several mils thick to give mechanical strength to the silicon wafer during the fabrication process. Furthermore, it is of relatively high resistivity material, typically about one ohm-centimeter, compared with much lower emitter and base region resistivities, because of the electrical requirements on the breakdown voltage and the capacitance of the base-to-collector junction. This resistance is represented diagrammatically by the element drawn in the collector region 65 and labeled $R_c$.

The switching speed of this transistor is limited by the time required to turn it "off." Here again, the high resistance of the collector body contributes greatly to this turn-off time. The collector zone 65 is flooded with excess holes while the transistor is "on" or is in its conducting condition. Before the transistor can be turned completely "off," these holes, represented by the plus charge signs in the collector region, must be completely swept out from the relatively large high resistivity, high lifetime collector zone. It is desirable to improve these parameters of the transistor, namely, switching speed and series voltage drop, without incurring major changes in the other electrical characteristics of the transistor.

These objectives are realized in the transistor 40 of FIG. 3. The inclusion of this layer 44, restricted to a region close to the collector junction and of relatively high and substantially uniform resistivity, maintains suitably high the breakdown voltage of the collector junction. Moreover, the fact that the layer 44 is relatively thin enhances the high frequency performance of the device. Furthermore, the thick low resistivity portion 45 of the collector zone provides the desired mechanical support for the fabrication and handling of the transistor element, and, at the same time, provides a region in which the carrier storage time is very low and the switching time of the transistor thereby is reduced. The carrier storage time can be reduced still more by treating the portion 45 to make it of lower lifetime material, as by introducing gold. In some instances, it is advantageous even to introduce gold into the epitaxial film to reduce its lifetime. This can be done by diffusion of gold with appropriate quenching.

The use of an epitaxial grown film of relatively high resistivity or of controlled resistivity on a low resistance semiconductor substrate is most advantageous compared with possible alternative solutions. One alternative which has been proposed involves diffusion from the electrode surface 66 of the collector zone 65 to reduce the resistivity therein. However, diffusion from two surfaces of a semiconductor wafer is difficult from the standpoint of precise control and costly as a consequence. Moreover, the diffused region thus provided in the collector zone is a graded region in which the impurity concentration diminishes from the surface inward. Thus, this graded region still retains a considerable series resistance. This is in contrast to the substantially high uniform impurity concentration which exists across the low resistance region 45 of the transistor 40 of FIG. 3.

A further advantage of the transistor structure illustrated in FIG. 3 is that the transistor 40 may be fabricated for a variety of uses simply by varying the thickness of the epitaxial grown film without, in many cases, varying the diffusion treatments which produce the base and emitter zones. The straightforward variation in the thickness of the film determines the ultimate thickness of the high resistivity or substantially intrinsic barrier layer 44 which, as has been pointed out above, in large part determines the breakdown voltage and the switching speed of the transistor. Accordingly, the advantages of the method of this invention for wide scale production of transistors, incorporating as it does the steps presently in the art, are obvious.

Although the invention has been disclosed in terms of a specific embodiment related particularly to a diffused junction transistor, it will be appreciated that the technique, broadly, has application to other semiconductor devices in which the same advantage may be realized. Other arrangements may be devised by those skilled in the art which also will be within the scope and spirit of the invention.

What is claimed is:

1. The method of making a junction transistor comprising the steps of forming by vapor deposition on a surface portion of a semiconductive body an epitaxial layer of higher specific resistivity than the specific resistivity of said surface portion, diffusing into a surface portion of the epitaxial layer a conductivity-type impurity for forming in said layer a first region of a conductivity type opposite that of said surface portion of said semiconductive body, while leaving a high specific resistivity portion of said epitaxial layer between said first region and the original surface portion of said body, and introducing into a limited surface portion of the first region a conductivity-type impurity of the type opposite that diffused into the first region for forming within said first region a second region of the opposite conductivity type, the second region serving as the emitter region, the first region serving as the base region, and the semiconductive body including the collector region of the junction transistor.

2. The method of making a semiconductive device comprising the steps of forming by vapor deposition on a surface portion of a semiconductive body an epitaxial layer of higher specific resistivity than the specific resistivity of said surface portion, diffusing into a surface portion of the epitaxial layer a conductivity-type impurity for forming in said layer a first diffused region of a conductivity type opposite that of said surface portion of said semiconductive body, while leaving a high specific resistivity portion of said epitaxial layer between said first diffused region and the original surface portion of said body, diffusing into a limited surface portion of the first diffused region of said epitaxial layer a conductivity-type impurity of the opposite type for forming within said diffused region a second diffused region of the conductivity type opposite that of the first diffused region, and providing an emitter connection to said second diffused region, a base connection to the first diffused region, and a collector connection to the semiconductive body.

3. The method of claim 2, further characterized in that the epitaxial layer formed is initially essentially all of the same conductivity type as said surface portion of the semiconductive body.

4. A transistor made in accordance with the process of claim 2.

References Cited in the file of this patent

UNITED STATES PATENTS

| | | |
|---|---|---|
| 2,561,411 | Pfann | July 24, 1951 |
| 2,692,839 | Christensen et al. | Oct. 27, 1954 |
| 2,811,653 | Moore | Oct. 29, 1957 |
| 2,898,248 | Silvey et al. | Aug. 4, 1959 |
| 2,967,793 | Philips | Jan. 10, 1961 |
| 2,981,877 | Noyce | Apr. 27, 1961 |
| 3,006,791 | Webster | Oct. 31, 1961 |
| 3,028,529 | Belmont et al. | Apr. 3, 1962 |
| 3,100,276 | Meyer | Aug. 6, 1963 |

FOREIGN PATENTS

| | | |
|---|---|---|
| 1,193,194 | France | Apr. 27, 1959 |

OTHER REFERENCES

Barredo: Semiconductor Abstracts, vol. IV, 1956, Battelle Memorial Institute, page 358, Abs. No. 1199.